United States Patent [19]
Raugh

[11] Patent Number: 4,583,298
[45] Date of Patent: Apr. 22, 1986

[54] AUTO CALIBRATION METHOD SUITABLE FOR USE IN ELECTRON BEAM LITHOGRAPHY

[75] Inventor: Michael R. Raugh, Palo Alto, Calif.

[73] Assignee: Hewlett-Packard Company, Palo Alto, Calif.

[21] Appl. No.: 587,084

[22] Filed: Mar. 7, 1984

[51] Int. Cl.[4] ............................................. G01C 25/00
[52] U.S. Cl. .................................... 33/502; 33/1 CC; 33/1 R; 73/1 R
[58] Field of Search ................ 73/1 R, 1 E, 1 J, 1 D; 33/502, 1 BB, 1 R, 1 CC

[56] References Cited

U.S. PATENT DOCUMENTS

| | | | |
|---|---|---|---|
| 3,087,247 | 4/1963 | Busch | 33/1 BB |
| 3,738,152 | 6/1973 | Green | 73/1 R |
| 3,769,709 | 11/1973 | Clarke et al. | 33/1 BB |

FOREIGN PATENT DOCUMENTS 2739527 8/1978 Fed. Rep. of Germany ....... 73/1 R

*Primary Examiner*—William D. Martin, Jr.
*Attorney, Agent, or Firm*—John A. Frazzini

[57] ABSTRACT

A method of selecting values for parameters in a calibration map used to correct for measurement errors. The locations of points in a grid on an uncalibrated calibration plate are measured for different orientations of the calibration plate. The parameters in the calibration map and the parameters relating the orientations of the calibration plate are determined to minimize the deviation from congruence of the image under the calibration map of the grid in each orientation. The orientations should be related by rigid motions having rotation axes that are separated sufficiently to remove uncertainties in the calibration which arise if the rotation axes are all collinear or nearly collinear.

17 Claims, 9 Drawing Figures

FIG 4 ial to be accurately aligned with features produced in another step using a second mask, it is important that the two masks are accurately aligned with each other and that the features within each mask are accurately located within each mask.

AUTO CALIBRATION METHOD SUITABLE FOR USE IN ELECTRON BEAM LITHOGRAPHY

BACKGROUND OF THE INVENTION

This invention relates in general to positional calibration methods and more particularly to calibration methods for use in correcting distorted measurements of position during production of integrated circuits. In contemporary photolithographic processing of wafers to generate integrated circuits, a succession of masks are utilized to control which areas of a wafer are etched, doped or coated during various processing steps. To ensure that features produced in one step using a first mask are accurately aligned with features produced in another step using a second mask, it is important that the two masks are accurately aligned with each other and that the features within each mask are accurately located within each mask.

The wafer is typically mounted on a wafer stage that can be translated in the two dimensional plane of the wafer. To accurately control such translations, many systems utilize an interferometer to measure the x-position and the y-position of the wafer stage. Even such an extremely accurate method of measuring position is becoming insufficiently accurate in contemporary processes in which sub-micron linewidths are being produced and in which alignment accuracies on the order of one-tenth of a micron are required. On this scale of accuracy, it is found that positions measured by the interferometers have small errors that can affect the quality of the circuits produced.

Such errors are significant in electron beam lithography because of the extremely small linewidths that can be produced. It is important in an electron beam system not only to accurately know the position of the wafer stage, but also to accurately know the position of the electron beam. Therefore, an electron beam system requires calibration of both the wafer stage translation apparatus and the electron beam deflectors.

Traditionally, positional calibration is effected by use of a calibration plate on which a Cartesian grid of points has been generated. To calibrate the interferometer measurements of the position of the wafer stage in an electron beam lithography system, the electron beam is utilized in a scanning electron microscope mode. In this mode, the electron beam deflectors are turned off so that the electron beam is undeflected. The calibration plate is mounted on the wafer stage and the wafer stage is translated to successively bring each of the grid points under the electron beam. The grid points are of a material, such as gold, that scatters the electrons into a detector. The incidence of the beam on a grid point is indicated by a jump in the signal from the detector.

Since the positions of the points of the calibration plate are known, the knowledge of these positions is used to correct the measured values of the positions. This correction is achieved by a calibration function which maps the measured values into calibrated-measured values. By definition, the calibration mapping is such that the calibrated measured values equal the known values of the positions of the grid points. In one approach, a two dimensional calibration polynomial is utilized to convert the uncalibrated measurements to calibrated measurements. The calibration process then involves the determination of the coefficients in the calibration polynomial so that the calibrated measurements of the points in the calibration grid equal the known positions of the points in the grid. In some versions of this approach, the form of the calibration polynomial is determined by assumptions about the sources of the measurement errors. For example, the interferometer mirrors can be modelled as having a small second order correction to being optically flat. Also, terms can be included to account for small rotations (i.e., roll, pitch and yaw) of the wafer stage as it is translated. Unfortunately, the positional accuracy required for current state of the art processes such as electron beam lithography is such that the supposed locations of the points in a calibration grid can have as much error as the positional measurement system to be calibrated. Therefore, the positions of the grid points can no longer be treated as known values to which the measured values can be adjusted. Thus, what is required is a calibration process in which calibration is achieved using a calibration plate in which the positions of the grid points are not precisely known.

In one approach, a calibration plate having grid points at imprecisely known locations is placed on the wafer stage and the locations of the grid points are measured. The grid plate is then rotated by 90 degrees about its center two or more times and in each of these orientations the positions of the grid points are measured. A finite calibration polynomial is assumed and the number of measurements is greater than the number of unknowns so that this information is utilized to find the unknown coefficients of the calibration polynomial. As is shown below in the Summary of the invention, there is some surprising indeterminacy in this approach so that it leads to an incomplete calibration of the system.

SUMMARY OF THE INVENTION

In accordance with the illustrated preferred embodiment, a calibration method is presented in which a calibration plate can be used containing a grid of points whose locations are not known as accurately as the accuracy to be achieved by the calibration. Such a calibration plate will be referred to herein as an "uncalibrated" calibration plate. The method utilizes "rigid motions" of the calibration plate. Such rigid motions are just motions in which the internal relationship between points (i.e., the distance between each pair of points in a grid and the angular relationship between each trio of points in the grid) are preserved so that the grid resulting from the motion is congruent with the grid before the motion. The example to be discussed will be the calibration of the position of a wafer stage in an electron beam lithography apparatus.

In this method, the calibration plate is assumed to be uncalibrated so that the locations of the points in the grid on the calibration plate are not assumed to be known quantities. Instead, it is only assumed that the relative positions of the grid points are fixed so that the plate can be moved by rigid motions. For convenience, an (x,y) Cartesian coordinate system is introduced on the wafer stage as a useful artifact for referencing the locations of the points of the grid. Thus, for a grid G having N points and lying on the wafer stage, the locations $(x_k, y_k)$ (for $k=1$ to N) of points located in the grid are treated as 2N unknowns. The act of measuring the positions of the grid points amounts to assigning a pair of instrument coordinate values $u_k$ and $v_k$ to each point $P_k$ of the grid. Since the instrument measurement may be nonlinear, the u-v coordinate system is in general a non-Cartesian coordinate system.

The calibration process results in the determination of a mapping C from the instrument (u,v) coordinates into a Cartesian coordinate system $(\bar{x},\bar{y})$. In FIG. 1, the grid points in grid G are shown in the (x,y) reference coordinate system and the act of measuring the grid points is represented as a map D (which mnemonically stands for "distortion" map) from the Cartesian (x,y) space to the non-Cartesian (u,v) space. The image under the map D of the grid G is represented as the grid DG in the (u,v) coordinate system. The calibration of the (u,v) measurements is represented by a calibration map C which maps the points in grid DG into the points of grid CDG in a Cartesian space of coordinates $\bar{x}$ and $\bar{y}$.

To be a calibration, any set of points in the (x,y) plane must be mapped into a geometrically similar set of points in the $(\bar{x},\bar{y})$ plane. In particular, the calibrated measured values of the grid points (i.e., their locations in the $(\bar{x},\bar{y})$ coordinate system) must be geometrically similar to grid G. This requires that grid CDG coincide, up to a rigid motion and isotropic change of scale, with the unknown actual locations of the grid points (i.e., their locations in the (x,y) coordinate system).

It is well known that a rigid motion in a two-dimensional Euclidean space is just a rotation about some rotation axis F by some angle a. To illustrate this in the present case, the coordinate axes (x,y) associated with grid G have been drawn in the coordinate system $(\bar{x},\bar{y})$. The angle a is just the relative angle between the y and $\bar{y}$ axes and the rotation axis is the location of the unique point F which is unmoved by the rigid motion (i.e., the fixpoint). The rigid motion is represented by R(a,F), where by convention a is measured in a counter-clockwise direction from some reference axis. When the rigid motion is a pure translation (i.e., no rotation), then the fixpoint is at infinity and the rigid motion is represented by a translation mapping.

If the calibration plate is moved on the wafer stage, then the original locations of the points in grid G can be viewed as a grid G$_1$ and the locations of the points after the movement can be viewed as a grid G$_2$ in the (x,y) coordinate system. Because the calibration plate is made of a rigid material, grid G$_2$ is related to grid G$_1$ by a rigid motion R(a,F). Because a calibrated mapping CD must preserve the angular relation between points, it is necessary that the congruence between G$_1$ and G$_2$ be reflected as congruence between their images (i.e., CDG$_1$ is congruent to CDG$_2$. It will be shown that the requirement that grid CDG$_2$ be congruent with grid CDG$_1$ enables calibration to be performed with a grid that is not itself calibrated. The issue in this analysis is whether it is sufficient to achieve calibration (i.e., that CDG is geometrically similar to G fo any grid G) by requiring that CDG$_2$ be congruent to CDG$_1$ for a particular choice of grid. It will be shown that, except for a set of cases of measure zero, this requirement is sufficient if at least three orientations of the grid are used and that these orientations are related by at least two distinct fixpoints. In this set of measure zero, the set of orientations having at least three fixed points relating them is still sufficient if a polynomial calibration function is assumed for the calibration mapping.

The use of the congruence between CDG$_1$ and CDG$_2$ is illustrated in FIG. 2. In the (x,y) coordinate system in FIG. 2 are shown four points of a grid in each of two orientations. The grid is placed on the wafer stage in a first orientation designated as G$_1$ and the locations of each of the points of the grid are measured. The grid is then placed on the wafer stage in a second orientation designated as G$_2$ and the locations of the points are again measured. In the example shown in FIG. 2, the two orientations are related by a 90 degree rotation about the point F. In the first orientation, the four points shown are indicated by P$_1$, ..., P$_4$ and in the second orientation the four points shown are represented by P$_1'$, ..., P$_4'$. The relation between G$_1$ and G$_2$ is represented symbolically as $$G_2 = R(a,F)G_1 \qquad (1)$$

where in this case a = −90 degrees.

As in FIG. 1, measurements are represented by a distortion map D and calibration is represented by a map C. The image of each point P in the (x,y) coordinate system is represented by the point $\bar{P}$ in the $(\bar{x},\bar{y})$ coordinate system. Since grids G$_1$ and G$_2$ can be viewed as points of a single grid G$_c$, the map CD must preserve the angular relation between the points in G$_1$ and those in G$_2$. If we knew that C is a calibration, then we would know that $\bar{G}_c$ is geometrically similar to G$_c$. This would let us conclude that, since the P$_k'$ are related to the P$_k$ by a 90 degree rotation about F, the geometrical similarity of G$_c$ with its image $\bar{G}_c$ would require that the $\bar{P}_k'$ be related to the $\bar{P}_k$ by a 90 degree rotation about the image $\bar{F}$ of fixpoint F. Instead, by our calibration procedure, we only know that CDG$_1$ is congruent to CDG$_2$. This requires that CDG$_2$ be related to CDG$_1$ by some rigid motion $R(\bar{a},\bar{F})$. In terms of the images $\bar{P}_k$ of the P$_k$, this relationship is represented symbolically as:

$$\begin{aligned}
CDR(a,F)P_k &= CDP_k' \\
&= \bar{P}_k' \\
&= R(\bar{a},\bar{F})\bar{P}_k \\
&= R(\bar{a},\bar{F})CDP_k
\end{aligned} \qquad (2)$$

for k = 1 to N. Since this is true for each value of k, this requires that:

$$CDR(\bar{a},\bar{F}) = R(\bar{a},\bar{F})CD \qquad (3)$$

when it acts on the set of points in grid G$_1$. By letting equation (3) operate on the point F, we find that CDF = $R(\bar{a},\bar{F})$CDF. This requires that CDF be unmoved by $R(\bar{a},\bar{F})$ and therefore $\bar{F}$ = CDF.

Because of the above rotational relationships about points F and $\bar{F}$, it is convenient to analyze these relationships in a polar coordinate system (r,b) centered on F and a polar coordinate system $(\bar{r},\bar{b})$ centered on $\bar{F}$. These polar coordinates are the distance r of a point from point F, the angular displacement b of that point about point F, the distance $\bar{r}$ of a point from $\bar{F}$, and the angular displacement $\bar{b}$ of a point about point $\bar{F}$. For the representation of the mapping CD as $\bar{r} = \bar{r}(r,b)$ and $\bar{b} = \bar{b}(r,b)$, equation (3) requires that $$\bar{r}(r_k, b_k + a) = \bar{r}(r_k, b_k) \text{ and} \qquad (4)$$

$$\bar{b}(r_k, b_k + a) = \bar{b}(r_k, b_k) + \bar{a} \qquad (5)$$

Equation (4) requires that $\bar{r}(r,b)$ be a periodic function of b with period a. Equation (5) implies a similar periodicity in $\bar{b}(r,b)$ which is more easily seen by defining $\bar{d}(r,b) = \bar{b}(r,b) - \bar{a}*b/a$, then equation (5) can be rewritten as $\bar{d}(r_k, b_k + a) = \bar{d}(r_k, b_k)$. This requires that $\bar{d}(r,b)$ be a periodic function of b with period a. Since any periodic functions $\bar{r}$ and $\bar{d}$ satisfy these equations, there is not a unique solution to equations (4) and (5). This indefiniteness is represented in the map CD shown in FIG. 2. For example, the radial line 21 can be mapped into an arbitrary line 24 if and only if line 23 (related to line 21 by the rotation $R(a,F)$) is mapped into a line 26 related to line 24 by a rotation $R(\bar{a},\bar{F})$.

It can be seen as follows that $\bar{a} = \pm a$. The $\pm$ sign represents the fact that a mapping that reverses polarity (i.e. that converts a right handed figure into a left handed figure) maps geometrically congruent objects into geometrically congruent geometric objects. Therefore, if C is a calibration mapping, then IC is also a calibration mapping where I is a mapping which reverses the orientation of the $(\bar{x},\bar{y})$ plane. The mapping I converts positive angle rotations into negative angle rotations and therefore the sign of $\bar{a}$ is indefinite. Therefore, in showing that the magnitude of a equals the magnitude of $\bar{a}$, we will assume that $\bar{a}/a$ is positive.

Because of the form of $\bar{b}(r,b)$, when b increases by a, then $\bar{b}$ increases by $\bar{a}$. If $\bar{a}$ is greater than a, then it appears that $\bar{b}$ increases faster than b thereby violating a requirement that a calibration map be one-to-one. However, because of the undetermined periodic portion of $\bar{b}(r,b)$ (i.e., $\bar{d}(r,b)$), it is not clear at first that $\bar{d}(r,b)$ cannot be selected to preserve the one-to-one requirement on the mapping. That this is not possible, can be seen by reference to FIG. 6. Let M be the smallest integer such that $M\bar{a} - Ma > 360$ degrees. In FIG. 6, this occurs for $M = 9$. This choice of M assures that there is at least one value of b in the interval $(Ma, M\bar{a})$ which is also a multiple of 360 degrees. In particular, the smallest value of $N*360$ for which $Ma < N*360$ degrees and N is a positive integer is in the interval $(Ma, M\bar{a})$. In FIG. 6 this occurs for $N = 4$. Because a one-to-one mapping must be monotonic, we know that if we increase b from Ma to $N*360$ degrees, then the associated value of $\bar{b}$ will be greater than $M\bar{a}$. Since this associated value of $\bar{b}$ is greater than $N*360$ degrees, we have the situation that N complete copies of the (x,y) plane are mapped into more than N complete copies of the $(\bar{x},\bar{y})$ plane, thereby violating the requirement that a calibration mapping be 1—1. Therefore, $\bar{a}$ cannot be greater than a. A similar argument shows that $\bar{a}$ cannot be less than a. Therefore, $\bar{a}$ must equal a to avoid this violation.

In general, when the angle a relating two orientations is a rational multiple m/n of 360 degrees (where m and n have no common integral divisor), then the period of the rotational symmetry about that point is $360/n$ degrees. The arguments utilized in regard to FIG. 2 are also applicable to cases with such angles. When the rotation angle is an irrational multiple of 360 degrees, then it is a mathematical necessity that the functions $\bar{r}(r,b)$ and $\bar{d}(r,b)$ are independent of b so that circular lines centered on point F (e.g., line 22) are mapped into circles centered on point $\bar{F}$ and radial lines through point F (e.g., line 21 are mapped into congruent lines through point $\bar{F}$). For these cases, the degree of indefiniteness in the mapping C is reduced but $\bar{r}$ and $\bar{b}$ are still arbitrary functions of r.

This analysis points out an inherent error in the prior art calibration procedure discussed in the Background of the invention. In that calibration procedure, the locations of the points in the calibration plate are measured in each of at least two orientations all related by a rotation about a common axis by some multiple of 90 degrees. The array of test points thus has a rotational symmetry about point F of period 90 degrees. Therefore, as in the solution to equations (4) and (5) above, the measurements are all consistent with any mapping $\bar{r}(r,b)$ and $\bar{d}(r,b)$ which is periodic in b with period 90 degrees. As is shown below in the Description of the Preferred embodiment, a computer simulation has been performed which shows that this prior calibration procedure can result in inaccurate calibrations even though the uncertainty in the measured values of the coefficients of the calibration polynomial are small.

In accordance with the preferred embodiment of the present invention, a calibration method is presented which utilizes a calibration plate that need not itself be calibrated. The calibration plate is placed on the surface of a wafer stage in at least three distinct orientations which are related to one another by rigid motions. These orientations are selected so that there is no single rotation axis about which they are all related to one another. One of these orientations is treated as a reference orientation and the parameters characterizing the rigid motions connecting the other orientations to the reference orientation are treated as unknown parameters. The conversion from the raw position measurements to the calibrated measurements is achieved by calibration functions having a finite number of parameters. In a particular embodiment of the method, the calibration is a finite polynomial and the calibration parameters are the coefficients of the various terms in the calibration polynomials. The rigid motions connecting each orientation to the reference orientation enable the non-reference orientation grids to be rotated into near coincidence with the reference orientation grid. The rotation angle and fixpoint for each of these rigid motions are also treated as unknown parameters. The physical values of these parameters are determined by the physical relationship of the orientations of the calibration plate. The numerical values of the parameters in the calibration map and the parameters charactizing the relationship between the orientations of the calibration plate are selected to maximize the degree of such coincidence.

The discussion following equation (5) above shows why the use of grid orientations related by rigid motions about a single rotation axis is inadequate to determine the calibration mapping C. It will now be shown by reference to FIGS. 3A–3C, that the use of at least three orientations related by rigid motions having at least two distinct rotation axes is adequate (except for a set of cases of measure zero) to determine uniquely the calibration mapping up to a rigid motion and isotropic scaling. This remaining uncertainty corresponds to the freedom of choice in selecting a particular Cartesian coordinate system and the scale (e.g., the units of measurement). In the case of the remaining set of measure zero, it will be shown that this method is still adequate if the calibration function is assumed to be a polynomial.

This discussion will utilize the observation about FIG. 2 that the 90 degree rotational symmetry about fixpoint F requires that the points $\bar{P}_k'$ be related to the points $\bar{P}_k$ by a 90 degree rotation. Similarly, the preiodicity in b of the mappings $\bar{r}(r,b)$ and $\bar{d}(r,b)$ also requires that points $P_k''$ and $P_k'''$ *related to the $P_k$* by rotations about point F by 180 degrees and 270 degrees, respectively, are mapped into points $\overline{PHD}\,k''$ and $\bar{P}_k'''$ respectively, which are related to points $\bar{P}_k$ by rotations about point $\bar{F}$ by 180 degrees and 270 degrees, respectively. The repetition of such arguments about a pair of fixpoints will now be used to show that the indeterminacy present in mapping CD in FIG. 2 is eliminated by the existence of two distinct fixpoints relating orientations of the calibration grid.

In FIG. 3A are shown in the reference coordinate system (x,y) a fixpoint A relating a first orientation (i.e., the reference orientation) to a second orientation and a fixpoint B relating the first orientation to a third orientation. Because this argument focusses on the fixed points instead of the points of the calibration plate, in each of FIGS. 3A-3C, the grid points of each configuration are not shown.

For purposes of illustration, it is assumed that the second orientation is related to the first orientation by a 90 degree rotation about point A and that the third orientation is related to the first orientation by a 60 degree rotation about point B. Under the symmetry about point A, just as the symmetry about point F in FIG. 2 requires that points $P_k''$ and $P_k'''$ are related to points $P_k$ by rotations about point F of 180 degrees and 270 degrees, respectively, the symmetry about point A requires that point B also have related points E, F and G (shown in FIG. 3B) related by 90 degree rotations about point A. Now applying the rotational symmetry about point F in FIG. 3B results in the set of points in FIG. 3C where, for example, the related points of point B under this symmetry are points $B'$, $B''$, ..., $B^v$.

By similarly utilizing the symmetry about each of the points in FIG. 3C, additional points required by the symmetry about points A and B can further be added. The set of all such points will be referred to as the symmetry set of the fixed points. It can be seen that further repetition of this process will eventually fill the entire (x,y) plane with the points in this symmetry set. In all but a set of cases of measure zero, this symmetry set is dense in the $(\bar{x},\bar{y})$ plane. The significance of these points is that the map CD preserves the angles between them (just as in FIG. 2) so that they are mapped into a geometrically similar set of points. Since these points fill the entire plane (i.e., are dense in the plane), the $(\bar{x},\bar{y})$ plane is geometrically similar to the (x,y) plane—that is, both planes are Cartesian and the map CD is at most the product of a rigid motion and a uniform rescaling of the distance between points. The scale of the map C is selected to preserve the distance between two points whose separation distance is known. This ensures that the image of the set of points in FIG. 3C is congruent with that set of points. Because the symmetry set of the fixpoints is dense, each grid point in any of the orientations is arbitrarily close to one of these fixpoints. This means that the distances and angles between grid points is preserved by the map CD and therefore map C is a calibration.

In a set of cases of measure zero, the symmetry set of the fixpoints is not a dense set. An example of such a situation is the case in which fixpoints A and B in FIG. 3A both have a 90 degree period of angular symmetry. In that case, the symmetry set is a grid of points, each of which is at a point (ms,ns) for some lattice spacing s and some pair of integers m and n. In general, each such symmetry set is still an infinite set extending out to infinity in all directions. It is seen as follows that such a set is sufficient to uniquely determine the calibration mapping if the calibration map is assumed to be a finite polynomial. Assume that map C is represented by the two finite polynomials $\bar{x}(u,v)=q_{ij}u^iv^j$ and $\bar{y}(u,v)=r_{ij}u^iv^j$ where the $q_{ij}$ and $r_{ij}$ are the unknown calibration parameters and the sum over i and j extends over all positive integers such that $i+j \leq P$ for some integer P. Also assume that map C is not unique so that there is another such map C' (which is identical to C for all points of the symmetry set) and that the difference C−C' is represented by a pair of finite polynomials x'(u,v) and y'(u,v) having the coefficients $q'_{ij}$ and $r'_{ij}$. Let m be the largest value of i for which some $q'_{ij}$ is nonzero, x'(u,v) can be rewritten as $$x'(u,v)=u^{m}*(q'_{ij}u^{i-m}v^j) \qquad (6)$$

It is assumed for C and C' that their difference is zero on all points of the symmetry set of the grid points. In particular, since this is true on the subset of these points within a strip of finite width about the u axis, a grid point can be found in this strip with u large enough that the term in the parentheses in equation (6) will be nonzero. Since $u^m$ is also nonzero there, the right hand side is nonzero. This contradicts the assumption that the left hand side of equation (6) is zero. This contradiction implies that x'(u,v) is identically zero. Similarly, y'(u,v) is identically zero and therefore C is determined uniquely by this calibration procedure.

It can be seen by reference to FIGS. 3C and 7 that in general the symmetry set of the fixpoints is dense. First, focus only on points A' and A" in FIG. 3C. Each of these points has 90 degree rotational symmetry about it. By use of the symmetry about point A', point A" has three other points associated by this symmetry, each separated by a 90 degree rotation about point A'. This replication can be repeated about each of these images, about each of these subsequent images, etc. until a Cartesian lattice of points is generated. This lattice is shown as the lattice 71 of small circles in FIG. 7. Similarly, points A' and $A^v$ can be used to generate the lattice 72 of dots in FIG. 7. The lattice spacing of lattice 72 is the square root of 3 times as large as the lattice spacing of lattice 71. Because of the irrational ratio of these lattice spacings, there is a point in lattice 71 that is arbitrarily close to a point in lattice 72. The two points likewise have 90 degree symmetry and so their symmetry can be utilized to fill the space with points having this arbitrarily small spacing. Therefore, the symmetry set of the fixpoints is dense for this case. This will be true for all but at most a countable number of cases, hence a set of cases of measure zero.

The disclosed invention should not be limited by some of the features which are inherent in the discription of the preferred embodiment but which are not necessary to the broad concept of the invention. To illustrate some of these features requires the introduction of the following terms. "Intrinsic geometry" means the internal geometry of a subspace. This concept is well developed in the study of surfaces and non-Euclidean spaces. As an illustration, consider a two-dimensional surface in a three-dimensional Euclidean space. The surface is said to be "embedded" in the three-dimensional space. In such a surface, the "intrinsic distance" between a pair of points is defined herein to be the length of the shortest curve in that surface connecting those two points. The intrinsic geometry involves the intrinsic distances between points and the angles of intersections of curves in the surface.

A "dimensionally stable" surface is defined herein to be a surface which can be deformed within the embedding three-space without significant changes in the intrinsic geometry of the surface For example, a piece of paper can be rolled into a cylinder, rolled into a cone or formed into a corrugated shape like corrugated sheet metal without changing the intrinsic geometry. For the purposes of this method, a calibration plate will be said to be dimensionally stable if the variation in the intrinsic distances between points on the calibration plate are negligible compared to the accuracy of calibration. A "rigid" calibration plate is defined herein to be a calibration plate that is dimensionally stable in three dimensions so that it cannot be bent in three dimensions.

The primary measure of the intrinsic geometry of a space is the intrinsic curvature of that space. In two dimensions, the intrinsic curvature is the Gauss curvature of the surface. The sheet of paper can be deformed into each of the forms listed above because they are all surfaces of constant intrinsic curvature. In a two-dimensional surface, the intrinsic curvature is proportional to the Gauss curvature of the surface. Euclidean spaces have zero intrinsic curvature but a portion of a sphere has constant non-zero intrinsic curvature. For surfaces of constant intrinsic curvature, a geometric figure in one portion of the surface can be moved to another part of the surface without changing the intrinsic shape of the figure. Such a movement will be referred to herein as a "dimensionally stable" motion. The disclosed calibration method is applicable to spaces of constant intrinsic curvature because the calibration plate can be moved without altering the intrinsic distance between grid points. In order to be usable in the calibration method, the calibration plate need only have the same constant intrinsic curvature as the stage on which it is placed and be of a dimensionally stable material. Like rigid motions which apply to rigid calibration plates, dimensionally stable motions are also defined by a rotation axis (i.e., a fixpoint) and an angle of rotation about that axis.

For the electron beam system it will typically be advantageous for the calibration plate not only to be dimensionally stable but in addition to be rigid because a rigid plate will yield a calibration of the projective distance between points, whereas a non-rigid dimensionally stable plate will yield a calibration of the intrinsic distance between points. To see this, imagine that the wafer stage has a corrugated shape with zero intrinsic curvature so that a flat calibration plate can be placed on the stage. If the plate is dimensionally stable and non-rigid, then it will conform to the wafer stage. For a choice of coordinate system in which the electron beam is in the z direction and the wafer stage is moved in the (x,y) plane, the measurements of the locations of points in the grid will only measure their x and y coordinates (i.e., their coordinates in the (x,y) plane resulting from projection of the points in the direction of the electron beam). Because their z-direction separation will not be measured, the measurements will indicate that points are closer to one another than they actually are. The calibration process will then effectively treat this as a distortion introduced by the measurement process and the calibration map will produce calibrated values which give the intrinsic distance between the points However, wafers to be exposed by the electron beam system are typically rigid and therefore will not conform to the shape of the wafer stage. As a result, it is the projective distances between points in a wafer and not their intrinsic distance that is of interest in exposing the wafer. Therefore a rigid calibration plate is advantageous in such a system.

The calibration method is illustrated in terms of a method in which the calibration plate is placed on a wafer stage, but the calibration can be inserted into the measurement field of the device in other ways. If such insertion results in the plate in one orientation being non-coplanar with another orientation, then the parameter get relating the orientations should include a parameter allowing for such non-coplanarity.

DESCRIPTION OF THE FIGURES

FIGS. 3A-3C illustrate how the existence of a pairs of distinct fixpoints relating orientations of a calibration point lead to a symmetry set of the fixpoints that is almost certainly dense in the measurement plane.

FIG. 4 illustrates the preferred method of orienting a calibration plate in a way that ensures the existence of more than one distinct fixpoint relating orientations.

DESCRIPTION OF THE PREFERRED EMBODIMENT

Figures 3A, 3B, 3C, 4:
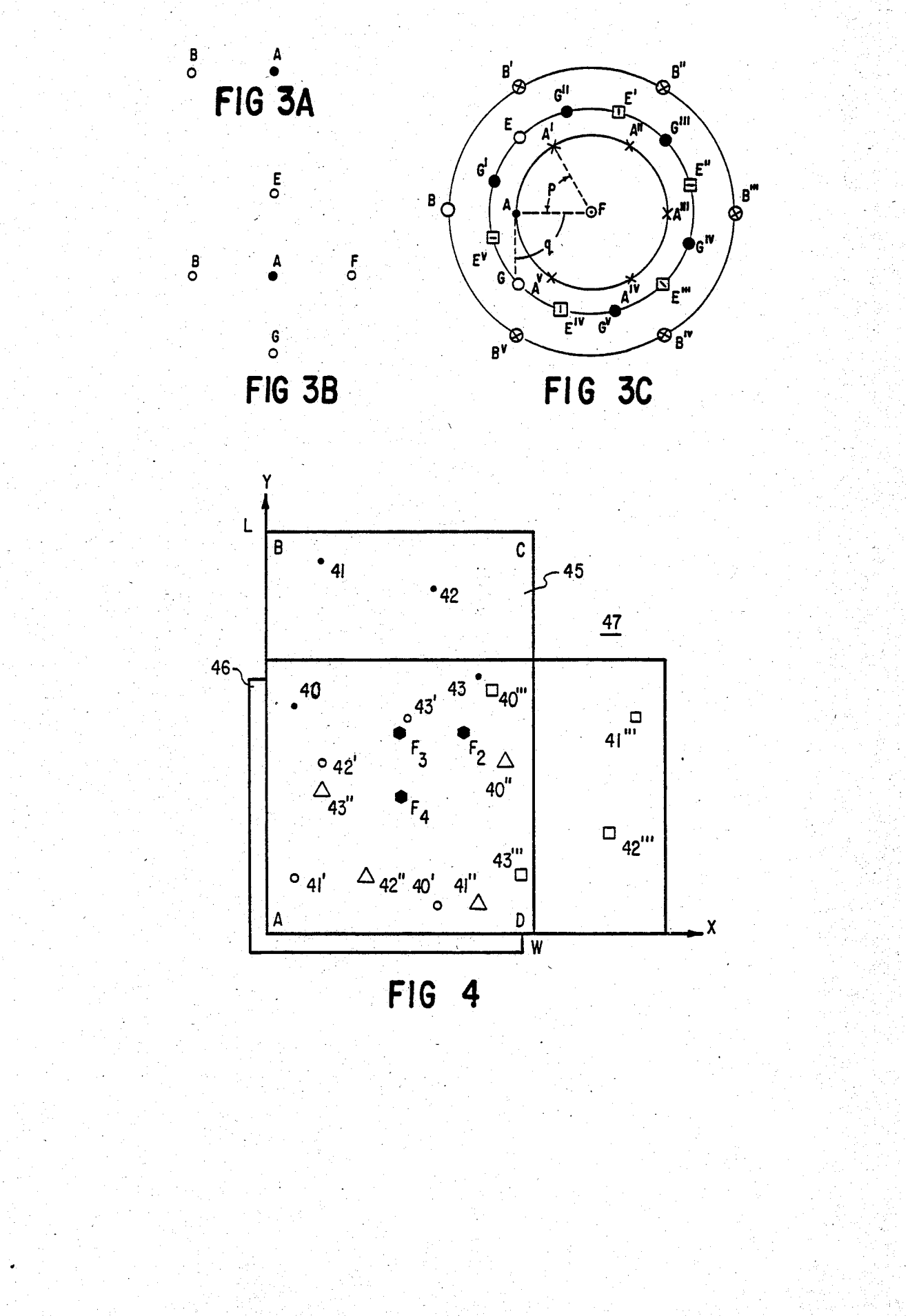
Figure 1:
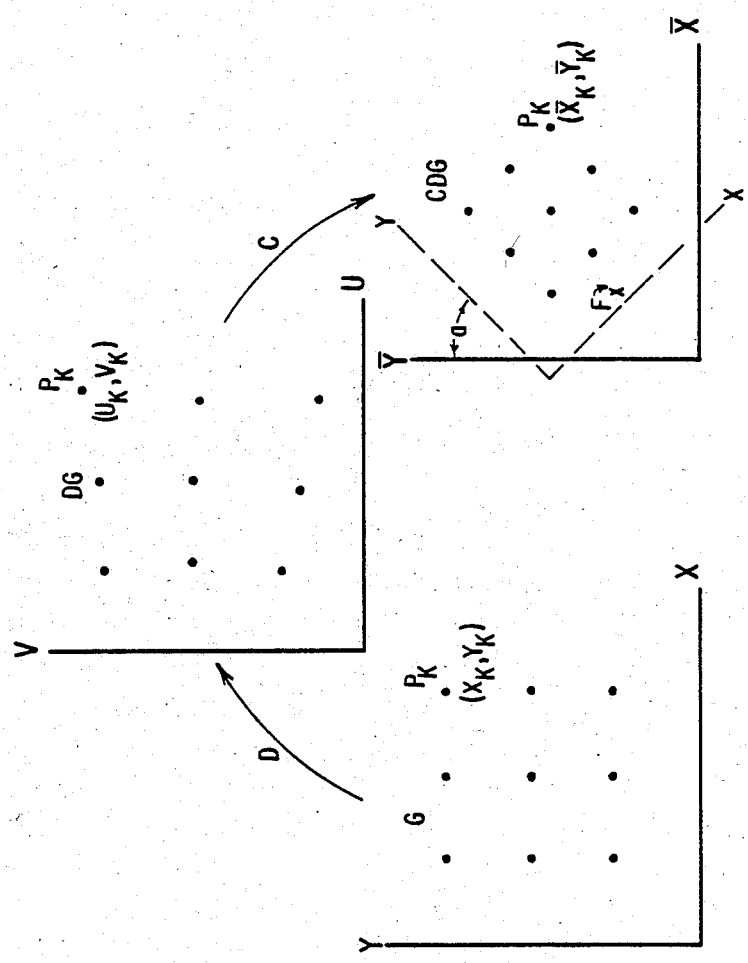
FIG. 1 represents graphically by maps D and C respectively measuring the locations of a set of points and correcting those measurements for nonlinearities.

In FIG. 4 is shown a calibration plate 45 on which are a set of points 40-43 for use in calibrating the interferometers in an electron beam system. The calibration plate is made of a material such as zerodur or borosilicate glass which maintains a constant geometric relationship between the points on the calibration plate during the calibration process. To calibrate the measurements of the position of a wafer stage 47, calibration plate 45 is used in conjunction with a frame 46 mounted on wafer stage 47.

Calibration plate 45 is initially oriented on the wafer stage by fitting a first corner A of plate 45 against frame 46 so that corner A is in contact with the corner of frame 46. To detect the locations of the points on the calibration plate, the electron beam is utilized in a scanning electron microscope mode. In this mode, the electron beam deflectors are turned off so that the electron beam is undeflected. The wafer stage is translated to successively bring each of the grid points under the electron beam. The grid points are of a material, such as gold, that scatters the electrons into a detector. The incidence of the beam on a grid point is indicated by a jump in the signal from the detector The location of the wafer stage is determined at each coincidence of a grid point with the electron beam so that in this manner the locations of all of the grid points are measured. As the wafer stage is moved during the measurement process, the wafer stage can roll, pitch and yaw, thereby introducing distortions into the measurement process. The amount of roll, pitch and yaw can be directly measured and the associated distortions of the measurement results can be compensated for by a precalibration map which is part of the measurement process.

Calibration plate 45 is then re-oriented on the wafer stage so that corner B is fitted firmly into the corner of frame 46. In this second orientation the locations of all of the points are again measured. This measurement procedure is again repeated with corner C fitted into the corner of frame 46 (i.e., the third orientation) and then with corner D fitted into the corner of frame 46 (i.e., the fourth orientation). The first orientation is treated as a reference orientation to which the second, third and fourth orientations are related by rotations about fixed points $F_2$, $F_3$ and $F_4$, respectively. The separation between these points is proportional to the difference between the length L and the width W of calibration plate 45. Thus, as long as the rectangular grid plate 45 is not square, there will be at least two distinct fixpoints resulting from this procedure and therefore, in the cases for which calibration can be effected by a polynomial and in cases for which the symmetry set of the fixpoints is dense, the calibration function will be unique up to an isotropic scale factor and rigid motion.

Figure 2:
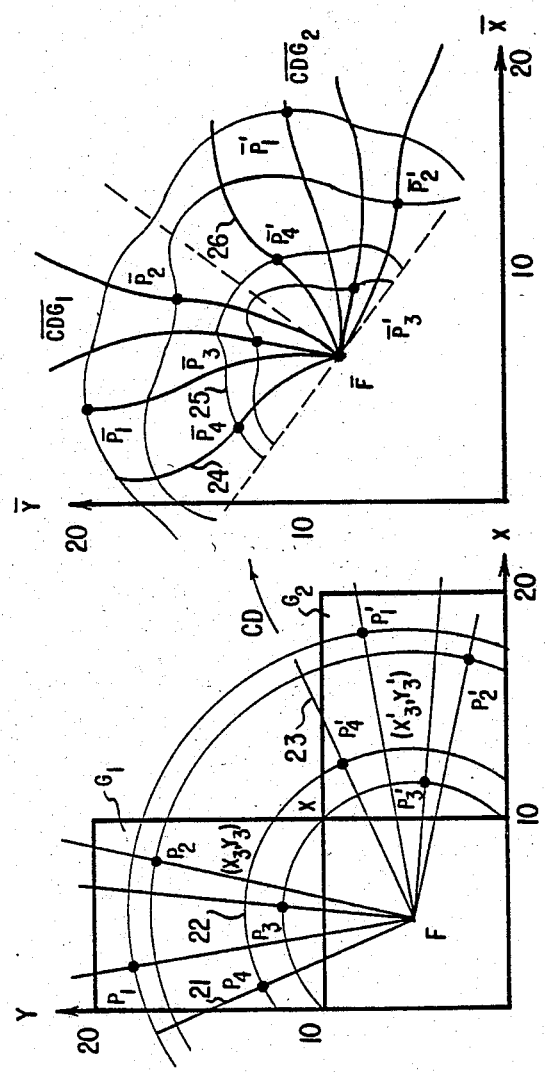
FIG. 2 illustrates the uncertainty in the calibration map C determined by a calibration procedure utilizing only a single fixpoints F relating orientations of a calibration grid.

The calibration map C is approximated by a pair of finite polynomials $$\bar{x}(u,v) = \sum_{i+j \leq P} a_{ij} u^i v^j \text{ and } \bar{y}(u,v) = \sum_{i+j \leq P} b_{ij} u^i v^j$$

of order P (i.e., the sum of the powers of u and v in any given term is equal to or less than P). Values of P on the order of 3 have been found to produce sufficiently accurate calibration for the systems on which this calibration method has been used. The values of the coefficients in these polynomials are determined by the following optimization procedure. Each of the second, third and fourth orientations is related to the first orientation by a rigid motion about point $F_2$, $F_3$ or $F_4$, respectively. As in FIG. 2, these fixpoints are mapped into the points $\bar{F}_2$, $\bar{F}_3$ and $\bar{F}_4$ calibrated measurement space (x,y) by the map CD. This map CD corresponds physically to measuring the locations of the points of the calibration plate and correcting these measurements with the calibration polynomials. The calibrated locations of the grid points in each of the second, third and fourth orientations are related to the locations of the points in the reference orientation by the rigid motions $R(a_2,\bar{F}_2)$, $R(a_3,\bar{F}_3)$ or $R(a_4,\bar{F}_4)$, respectively. The $a_k$, $\bar{F}_k$ and calibration coefficients are treated as unknowns. If the measurements had no measurement error and the calibration were perfect, then these rigid motions would map the grid in each of the second, third and fourth orientations on top of the grid in the first orientation. However, because of errors, there is not perfect congruence of these grids. Therefore, the unknown parameters are selected to maximize the amount of coincidence of the grids in the rotated second, third and fourth orientations with the grid in the first orientation. A convenient measure of the deviation from coincidence is the mean squared error E:

$$E = \sum_i \sum_j ((\bar{x}'_{ij} - \bar{x}_{1j})^2 + (\bar{y}'_{ij} - \bar{y}_{1j})^2) \quad (7)$$

where $$\begin{pmatrix} \bar{x}'_{ij} \\ \bar{y}'_{ij} \end{pmatrix} = R(a_i,\bar{F}_i) \begin{pmatrix} \bar{x}(u_{ij},v_{ij}) \\ \bar{y}(u_{ij},v_{ij}) \end{pmatrix} \quad (8)$$

and where $u_{ij}$ and $v_{ij}$ are the measured values of the location of the jth point of the calibration grid in the ith orientation. The unknown parameters are selected to minimize this measure of the error. Other measures of error, well known in error analysis, could alternatively be used in place of E.

As was indicated above, a calibration function is determined in general only up to a choice of scale and a choice of the origin and rotational orientation of the axes of the $(\bar{x},\bar{y})$ coordinate system. In order to pin down a particular choice so that the coefficients of the calibration functions are uniquely determined, the parameters $a_{00}$, $b_{00}$, $a_{01}$ and $a_{10}$ are specified. $a_{00}$ and $b_{00}$ are chosen to be zero so that the origin of the (u,v) coordinate system is mapped into the origin of the $(\bar{x},\bar{y})$ coordinate system. $a_{01}$ is chosen to be zero so that the $\bar{x}$ axis is tangent to the u axis at the origin. $a_{10}$ is chosen to be equal to one so that the local scale at the origin in the u direction is the same as the local scale at the origin in the $\bar{x}$ direction. The choice of a scale factor is needed in addition to normalize the error calculation in equation (7)—otherwise, the error could be made arbitrarily small merely by selecting the parameters $a_{ij}$ and $b_{ij}$ to be arbitrarily small.

The grid of points on the calibration plate need only have enough points that the number of independent equations relating the unknowns to the measured values is greater than the number of unknowns. However, having a much larger number of points in the grid enables the calibration parameters to be selected more accurately. Also, it is advantageous to have grid points located throughout the field of the electron beam so that the calibration is performed throughout the entire field. The calibration plate should therefore be at least as large as this field and the grid points should be located throughout the calibration plate. The grid points can be located randomly throughout the grid, but it is advantageous to have the points located at approximately known locations to facilitate control of the wafer stage to successively move each of the grid points into coincidence with the electron beam. One numerical procedure which has been used to compute the optimal parameter values is based on the Gauss-Newton Algorithm presented in the text entitled "Numerical Methods" written by Dahlquist, Bjorck and Anderson, Prentice Hall, 1974, Englewood Cliffs, p444. A five inch by five inch calibration plate having a nearly Cartesian grid of between 100 and 900 points has been found to produce accurate calibration.

In a modification of the above method, the electron beam is brought into coincidence with each of the points in the calibration grid by deflecting the beam as well as moving the wafer stage. In this calibration method, the electron beam is only deflected within a range that is small enough that the corrections achieved by calibrating deflection of the beam can be ignored. The wafer stage is then successively moved to bring the electron beam into near incidence on a point in the grid and then the beam is deflected to bring the beam into incidence on that point. The location in each point is then determined by the movement of the wafer stage and the amount of deflection to achieve incidence for that point.

Numerical Simulation

To test the accuracy of the calibration procedure, a numerical simulation has been performed which utilizes the numerical values for the locations of points in a first simulation grid and a set of three other simulation grids related to the first simulation grid by approximate 90 degree rotations of the first simulation grid about specified pivot points. Measurement error was simulated by normal random perturbation of each point. Device distortion was simulated by applying a cubic distortion function derived from calibration polynomials that had been previously determined by the disclosed calibration procedure. The distortion function approximates the inverse function of the calibration polynomials.

The numerical simulation analyzed a set of four views to determine cubic calibration polynomials. These calibration polynomials were then applied to reconstruct the measurements of each view in Cartesian coordinates. Each of these images will be referred to herein as a calibrated simulation grid. Views 2–4 were then rotated into optimal juxtaposition with view 1. In effect, this yielded a cluster of four measurements for each grid point in view 1, and the centroid of each cluster was calculated. The ordered set of all centroids was used as the reconstructed grid. This method has the advantage that it estimates grid positions using all of the data uniformly. The variance of each cluster was then calculated about the centroid of the cluster. Then the square-root of the average variance of all clusters was calculated, giving a measure of the deviation from congruence of r reconstructions and providing an internal consistency check on the calibration. If the calibration were perfect, the latter measure should equal the measurement error. Note that, if the original grid were unknown as it is in the real (unsimulated) case, some such measure of internal consistency would be the only way to verify a calibration.

Finally, to provide an external test of the calibration, the reconstructed grid was compared point-by-point with the original grid that was fed into the simulation program. Here the two grids were brought into juxtaposition by an optimal rigid motion. Thus, each original point was brought into near coincidence with its reconstruction, the distance between them squared, and the sum of squares averaged and square-rooted, yielding a standard error. In effect, this value measures the deviation from congruence of the set of simulation grids with the set of calibrated simulation grids. If the calibration were perfect, then this standard error should be ½ of the measurement standard error. The reason is that each grid point was averaged over four measurements. Hence, the standard error should go down by a factor of the square-root of the number of measurements. Another measure of the deviation from congruence of the simulation grid with its calibrated simulated image is the maximum distance between a point in the former grid from its image point in the latter grid.

Figures 5, 6, 7:
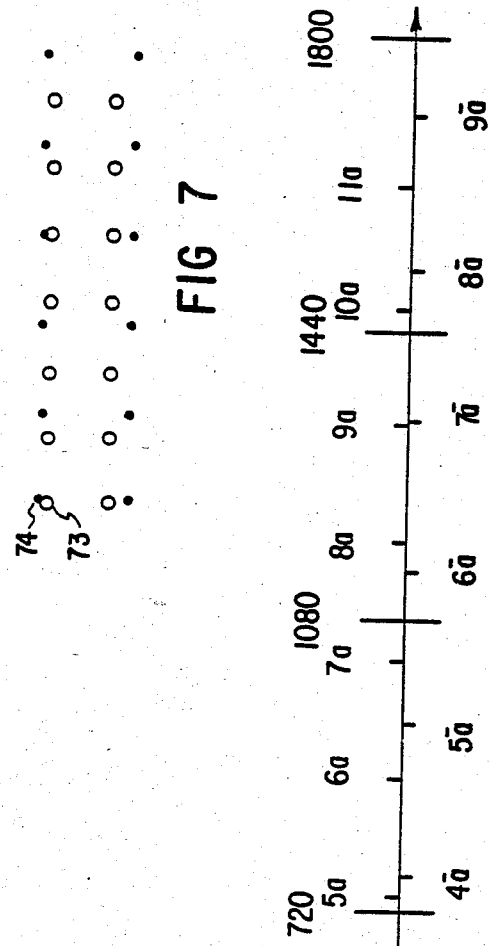
FIG. 5 contains a table showing the results of a numerical simulation showing the need for adequate displacement between fixpoints.
FIG. 6 illustrates why angle $\bar{a}$ is equal to angle a in the discussion of FIG. 2.
FIG. 7 illustrates why the symmetry set of fixpoints is almost always dense.

The results are summarized in the table in FIG. 5 where standard error of measurement, internal consistency of views, and comparisons of the ideal grid to the reconstructed grid are shown as functions of the rectangular excess e, where $e=(L-W)$, L is the length of the calibration plate and W is the width of the calibration plate. In all cases, the measurement error as computed by the calibration program is identical to the standard error built into the simulated data, namely 0.05 microns. The internal consistency, as described above, was found to be nearly identical to the standard error of measurement, as it should be.

The surprising result is that, while the internal consistency was excellent in all simulated cases, the comparison of the reconstructed grid with the original grid varied dramatically as a function of rectangular excess, e. It can be seen in the table that for a square grid plate, the maximum error was found to be 6.5 microns, while the standard error was 1.8 microns. Things are much more satisfactory for a grid plate with rectangular excess of 8 mm, for in this case the external standard error is 0.03 microns and the maximum error is 0.08 microns.

Theoretically, with the measurement of four views and sufficiently oblong rectangular grid plate, one should be able to reduce the external error to 0.025 microns, but as a practical matter, it would be difficult to fit such an oblong rectangle into frame 46 in FIG. 4.

These results show that previous methods utilizing a single fixed point relating separate views will be inaccurate even though the value of the mean square error function E is small. These results also show that, if the separation between fixpoints is too small, then the calibration can be inaccurate. In general, the separation should be such that the average error determined by the numerical simulation is on the order of the measurement error assumed in the simulation. In particular, the average error should be no more than 25% larger than the assumed measurement error. There are other methods of assuring that there are distinct rotation axes that are sufficiently spaced that the calibration will be accurate. For example, instead of fitting each corner of a rectangular plate into the same corner of a frame, the various orientations can be produced by fitting the same corner of the plate into each corner of a rectangular frame Any such methodical method of producing the various orientations will produce a pattern of rotation axes relating those orientations. For a given pattern, the scale of the pattern should be chosen to produce adequate separation between the rotation axes that the deviation from congruence of the set of calibrated simulation grids with the simulation grids is minimized as a function of this scale.

Once the translational measurements have been calibrated for a particular electron beam lithography system, the beam deflector can also be calibrated. A target point which scatters the electron beam is moved to a set of locations throughout the field of the electron beam and the deflector settings are varied. Either by adjusting the location of the target point for a given deflector setting or adjusting the deflector settings for a given target point location, the beam and target are brought into coincidence. The correlation of the deflector settings with the target locations calibrates the deflector.

A calibrated electron beam lithography system can be used to accurately measure the locations of the points in a grid so that the grid is calibrated even though the process by which the grid is manufactured is less accurate than the required calibration accuracy. Such a grid which has been calibrated by the above calibration method can then be utilized to calibrate other systems by the traditional calibration method—namely, the locations of the grid points are known and therefore, measurement of these locations correlates the measured locations with the known locations, thereby serving to calibrate the system.

I claim:

1. A method of calibrating measurement values produced by a measuring device, said method being of the type in which a calibration map is used to map measured values into a calibrated coordinate system to correct for distortions in the measurement process, in which the calibration map contains a first set of parameters that are determined by the calibration method and in which the locations of points in a grid on a calibration plate are measured, said method comprising the steps of:

(a) orienting the calibration plate in a plurality of different orientations related to one another by the physical values of a second set of parameters, one of said orientations being referred to herein as the reference orientation and the other orientations being referred to herein as non-reference orientations;

(b) for each orientation, measuring the locations of the points in the grid;

(c) for each orientation, by use of the calibration map, determining the calibrated measured values for each grid point, thereby producing in the calibrated coordinate system an image of the grid for that orientation;

(d) selecting numerical values for the first and second sets of parameters to minimize the deviation from congruence with one another of the images of the grid in the calibrated coordinate system.

2. A method as in claim 1 wherein step (a) comprises placing the calibration plate in a plurality of orientations on a stage of the measuring device.

3. A method as in claim 2 wherein the stage has constant intrinsic curvature, the calibration grid is dimensionally stable and the orientations are related by dimensionally stable motions of the calibration plate.

4. A method as in claim 3 wherein the stage is substantially planar, the calibration plate is rigid and the orientations are related by rigid motions.

5. A method as in claim 3 wherein the calibration plate is a polygon and wherein step (a) comprises successively fitting each of the corners of the calibration plate into a corner of a frame mounted on the stage.

6. A method as in claim 5 wherein the polygon is non-equilateral and wherein the angular size of the corners of the polygon are all equal and are equal to the angular size of said corner of the frame.

7. A method as in claim 3 wherein the frame is a polygon and wherein step (a) comprises successively fitting the same corner of the calibration plate into each of the corners of a polygonal frame mounted on the stage.

8. A method as in claim 7 wherein the frame is a non-equilateral polygon and wherein the angular size of the corners of this polygon are each equal and are equal to the angular size of said corner of the calibration plate.

9. A method as in claim 3 wherein each dimensionally stable motion has a rotation axis and an angle of rotation about that axis and wherein at least two of these rotation axes are distinct.

10. A method as in claim 1 further comprising after step (d) the step of:

(e) performing a numerical simulation of the accuracy of calibration achieved by the calibration map.

11. A method as in claim 10 wherein step (e) comprises the steps of:

(f) determining a distortion map which is substantially equal to the inverse of the calibration map determined by steps (a)–(d);

(g) selecting a set of congruent simulation grids in the calibrated coordinate system, at least three of the grids being related by rigid motions having distinct rotation axes;

(h) for each point in the grids in step (h), producing simulated measured values, each value being the sum of a random simulated measurement error and the value determined by the distortion map, thereby producing in a space of simulated measured values a set of grids, each of which is the image under the distortion map of a simulation grid, each such image being referred to herein a measured grid:

(i) performing steps (c) and (d) for this set of simulated measured values to produce simulated calibrated measured values thereby producing in the calibrated coordinate system an image of each of the measured grids, these images of the measured grids being referred to as the set of calibrated simulation grids;

(j) determining the amount of deviation from congruence of the set of calibrated simulation grids from the set of simulation grids.

12. A method as is claim 11 wherein the physical value of a parameter in the second set of parameters substantially minimizes the deviation from congruence (determined in step (j)) as a function of this parameter.

13. A method as in claim 11 wherein the orientations in step (a) are related to one another by dimensionally stable motions, each of which is characterized by a rotation axis and an angle of rotation about that axis.

14. A method as in claim 13 wherein, for a given pattern of rotation axes and given rotation angles, the scale of distances between rotation axes in the pattern substantially minimizes the deviation from congruence (determined in step (j)) as a function of this scale parameter.

15. A method as in claim 12 further comprising a plurality of repetitions of steps (a)–(e) for a range of values of a parameter in the second set of parameters to determine what range of values of this parameter substantially minimizes as a function of this parameter the deviation from congruence (determined in step (j)).

16. A method as in claim 15 wherein the orientations in step (a) are related to one another by dimensionally stable motions, each of which is characterized by a rotation axis and an angle of rotation about that axis and wherein, for a given pattern of rotation axes and given rotation angles, the scale of distances between rotation axes in the pattern is chosen to substantially minimize the deviation from congruence (determined in step (j)) as a function of this scale parameter.

17. A method of calibrating measurement values produced by a measuring device, said method being of the type in which a calibration map is used to map measured values into a calibrated coordinate system to correct for distortions in the measurement process and in which the calibration map contains a first set of parameters that are determined by the calibration method, said method comprising the steps of:

(k) measuring the locations of points in a grid on a calibration plate, the relative locations of the points in the grid being known by use of the method in claim 1, said calibration map functioning to produce an image of said grid in the calibrated coordinate system;

(l) selecting the values of the first set of parameters to minimize in the calibrated coordinate system the deviation from congruence of the image of the measured points with the grid on the calibration plate.

* * * * *

UNITED STATES PATENT AND TRADEMARK OFFICE
CERTIFICATE OF CORRECTION

PATENT NO. : 4,583,298
DATED : 04/22/86
INVENTOR(S) : Michael R. Raugh

It is certified that error appears in the above-identified patent and that said Letters Patent is hereby corrected as shown below:

Column 4, line 43, "CDR($\bar{a},\bar{F}$)=R($\bar{a},\bar{F}$)CD" should read --CDR(a,F)=R(a,F)CD--.

Column 6, line 63, "$\bar{P}$HD k" should read --$\bar{P}_k$"--.

Column 10, line 3, "get" should read --set--.

Column 10, line 12, "fixpoints" should read --fixpoint--.

Column 11, line 32, "(x,y)" should read --($\bar{x},\bar{y}$)--.

Signed and Sealed this

Twelfth Day of August 1986

[SEAL]

Attest:

DONALD J. QUIGG

Attesting Officer

Commissioner of Patents and Trademarks